April 13, 1954 JACQUES I. PANTCHECHNIKOFF NOW BY CHANGE OF NAME JACQUES ISAAC PANKOVE 2,675,433

DEGENERATIVE AMPLIFIER

Filed April 27, 1950

INVENTOR
JACQUES I. PANTCHECHNIKOFF
BY H. O. Newton
ATTORNEY

Patented Apr. 13, 1954

2,675,433

UNITED STATES PATENT OFFICE 2,675,433

DEGENERATIVE AMPLIFIER

Jacques I. Pantchechnikoff, now by change of name Jacques Isaac Pankove, Princeton, N. J., assignor to Radio Corporation of America, a corporation of Delaware Application April 27, 1950, Serial No. 158,359

7 Claims. (Cl. 179—171)

This invention relates generally to degenerative amplifiers, and more particularly relates to a degenerative feedback amplifier utilizing a semi-conductor device having a rectifier section and an amplifier section.

The degenerative amplifier of the present invention utilizes a semi-conductor device consisting of an amplifier section and a rectifier section having a common electrode, as disclosed and claimed in applicant's copending application, Serial No. 84,671, filed March 31, 1949, and assigned to the same assignee as this application. The device referred to consists of a semi-conductor amplifier or transistor having an additional rectifying electrode which cooperates with the base electrode of the amplifier section to provide a rectifier.

It is a principal object of the present invention to provide an improved degenerative amplifier utilizing a combined semi-conductor rectifier and amplifier device of the type above referred to.

A further object of the invention is to provide a degenerative amplifier of the type referred to where the amount of degeneration may be adjusted thereby to suppress either partially or entirely a predetermined polarity of the input signal such as the negative portion thereof.

The degenerative amplifier circuit of the present invention comprises a semi-conductor device having a semi-conducting crystal. A base electrode, an emitter electrode and a collector electrode are in contact with the crystal. A further electrode is in rectifying contact with the crystal and forms together with the base electrode, the rectifier section of the device.

An input signal is impressed on the base electrode while the amplified output signal is derived from the collector electrode. A degenerative feedback path is provided between the collector electrode and the additional rectifier electrode of the device. Accordingly, a certain polarity of the amplified output signal will render the rectifier conducting so that a current will flow in the external base circuit. This current opposes the current developed simultaneously by the input signal. Consequently, a predetermined polarity of the input signal is either partially or completely suppressed. If the crystal is of the N type the negative portion of the input signal will be suppressed either partially or completely. If the negative portion of the input signal is completely suppressed, only the positive portion of the input signal is amplified and may be developed with reversed polarity across the external collector impedance.

Figure 1:
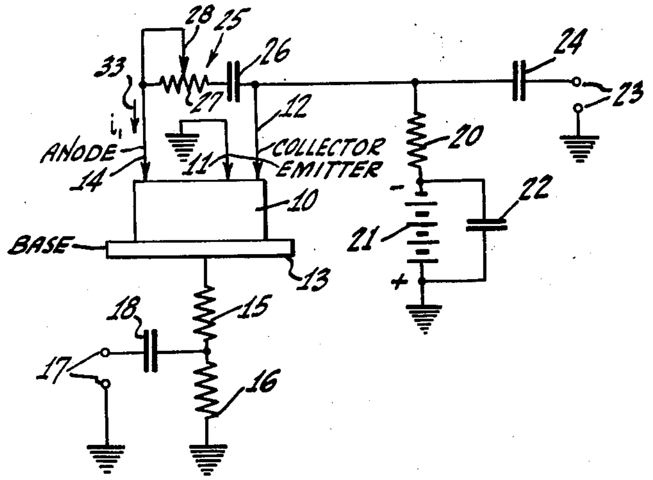
Figure 2:
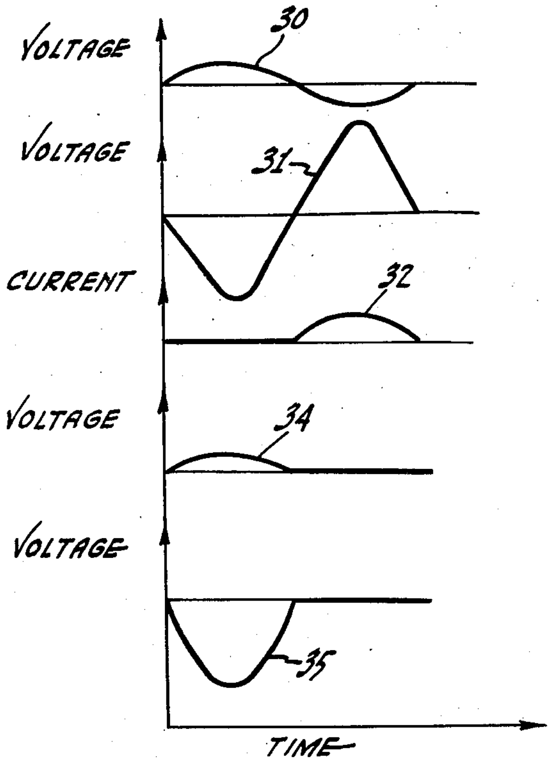

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a circuit diagram of a degenerative amplifier circuit embodying the present invention; and Figure 2 is a graph illustrating voltages and currents appearing at different points of the circuit of Figure 1.

Referring now to Figure 1 there is illustrated a degenerative amplifier circuit utilizing a multi-electrode semi-conductor device disclosed in applicant's copending application above referred to. The device comprises an amplifier section including a block 10 of semi-conducting material which may consist, for example of germanium, silicon, boron, tellurium or selenium containing a small but sufficient number of atomic impurity centers or lattice imperfections, as commonly employed for best results in crystal rectifiers. Germanium is the preferred material for block 10 and may be prepared so as to be an electronic N type semi-conductor, as is well known. The surface of semi-conducting body or block 10 may be polished and etched in a conventional manner. It is also feasible to utilize the germanium block from a commercial high-back-voltage rectifier such as the type 1N34 in which case further surface treatment may not be required.

Semi-conducting body 10 is provided in a conventional manner with emitter electrode 11, collector electrode 12 and base electrode 13. Emitter electrode 11 and collector electrode 12 are in rectifying, high-resistance contact with body 10 and may, for example, be point contacts which may consist, for example, of tungsten or Phosphor-bronze wires having a diameter of the order of 2 to 5 mils. Emitter and collector electrodes 11 and 12 are ordinarily placed closely adjacent to each other and may be separated by a distance of a few mils. Base electrode 13 provides a large-area, low-resistance contact with the bulk of semi-conductor 10. Emitter electrode 11, collector electrode 12 and base electrode 13 form the amplifier section of the device.

Rectifier electrode 14 is also a rectifying electrode which may be a point contact and is spaced from emitter electrode 11 and collector electrode 12 such a distance as to prevent substantial interaction through surface conduction between rectifier electrode 14 on the one hand and emitter electrode 11 and collector electrode 12 on the other hand. Thus, rectifier electrode 14 should be spaced no less than 20 mils from either emitter electrode 11 or collector electrode 12. In order to improve the operation of the amplifier section 11, 12, 13, collector electrode 12 may be pulsed by discharging a capacitor between collector electrode 12 and base 13 while current is permitted to flow between emitter 11 and collector 12. In that case, rectifier electrode 14 should be disconnected while the collector electrode is pulsed. If body 10 consists of an N type electronic semi-conductor such as an N type germanium crystal, rectifier electrode 14 forms the anode of the rectifier section as indicated. In that case, base electrode 13 functions as the cathode of the rectifier section. It is, however, also feasible to utilize a body 10 consisting of a P type electronic semi-conducting material such as a P type germanium crystal. In that case, rectifier electrode 14 would be the cathode of the rectifier section while base electrode 13 would be its anode. For the following discussion, however, it is assumed that body 10 consists of an N type electronic semi-conducting material.

Base electrode 13 is connected to ground through resistors 15 and 16 connected in series. An input signal is impressed on input terminals 17. One of the input terminals is grounded while the other terminal is coupled through capacitor 18 to the junction point between resistors 15 and 16. Emitter electrode 11 is grounded as shown. Collector electrode 12 is connected to ground through the series combination of resistor 20 and battery 21 having its positive terminal grounded. Capacitor 22 may be connected across battery 21 for bypassing alternating currents. Accordingly, a negative voltage is impressed on collector electrode 12. Generally, collector electrode 12 should be based with respect to base electrode 13 in a reverse direction. This requires a negative bias voltage in case body 10 consists of an N type crystal. However, if body 10 should consists of a P type crystal, collector electrode 12 should be supplied with a positive potential. The current flowing between collector electrode 12, base electrode 13 and through resistors 15 and 16 will normally maintain the base electrode at a negative potential with respect to ground. Consequently, emitter electrode 11 is positive with respect to base electrode 13, that is, it is biased in a forward direction.

The output signal may be derived across collector resistor 20. Thus, the output signal may be obtained through output terminals 23, one of which is grounded while the other is coupled to collector electrode 12 through coupling capacitor 24. In accordance with the present invention, a feedback connection 25 is provided between collector electrode 12 and anode or rectifier electrode 14. The feedback connection includes capacitor 26 and resistor 27 connected in series. A portion of resistor 27 may be bypassed by variable tap 28.

The operation of the degenerative amplifier of the present invention will be more clearly understood by reference to Figure 2. Let it first be assumed that no feedback connection 25 is provided between collector electrode 12 and anode 14. In that case, the circuit of Figure 1 functions as an amplifier without feedback. The input signal impressed on input terminals 17 is shown at 30 in Figure 2. For convenience, input signal 30 has been shown as a sine wave but it is to be understood that other types of input signals may be used. The input signal 30 is impressed across resistor 16. The voltage developed at the junction point between resistors 15 and 16 is then impressed on base electrode 13. During the positive portion of the input signal, base electrode 13 is accordingly made more positive or less negative. Consequently, the voltage between emitter electrode 11 which is maintained at ground potential, and base electrode 13 is reduced. This, in turn, will reduce the collector current flowing through collector resistor 20 so that collector electrode 12 becomes more negative as shown by curve 31.

During the negative portion of the input signal, base electrode 13 becomes more negative, thus increasing the voltage between emitter electrode 11 and base electrode 13. This will increase the collector current flowing through collector resistor 20. The thus produced voltage drop across resistor 20 will render collector electrode 12 more positive as clearly shown by curve 31.

Let it now be assumed that feedback connection 25 is present. As long as collector electrode 12 is more negative corresponding to a positive portion of the input signal, no current will flow between anode 14 and base electrode 13. However, as soon as collector electrode 12 becomes more positive anode 14 will become positive with respect to base electrode 13. Consequently, a current will flow between anode 14 and base electrode 13 which has been shown by curve 32 in Figure 2. This current may be traced from anode 14 to base electrode 13, resistors 15, 16 and back through battery 21, resistor 20, collector electrode 12 to anode 14. The charge which may accumulate in capacitor 26 will leak off through the high back-resistance of the rectifier circuit, that is, through anode 14, base electrode 13, resistors 15, 16 and back through the collector circuit. The back-resistance of rectifier section 14, 13 is not infinite but of such a size as to provide for a direct current return connection between anode 14 and base electrode 13. This current through the rectifier section of the circuit has been indicated by $i_1$ in Figure 1 and its direction is shown by arrow 33. It will now be seen that this current flowing through resistors 15 and 16 will oppose the current flowing in the opposite direction through resistor 15 in response to the negative portion of the input signal.

The combined voltage impressed on base electrode 13 is shown by curve 34. Thus, the positive portion of the input signal remains unchanged because the rectifier section 14, 13 remains substantially non-conducting. However, the current flowing through rectifier section 14, 13 in response to collector electrode 12 becoming more positive partially or completely cancels the current flowing through resistor 15 in response to the input signal. The amount of current flowing through feedback connection 25 may be controlled by variable tap 28 so that any desired portion of the input signal current may be cancelled.

The resulting amplified output voltage is indicated by curve 35. Thus, the amplifier of the present invention will clip or remove the negative portion of the input signal or a portion thereof while the positive portion of the input signal appears amplified and with phase reversal at collector electrode 12. The degenerative feedback connection 25 provides a low impedance path for the negative portion of the input signal. As explained hereinbefore the negative portion of the input signal corresponds to the positive portion of the output signal.

While it will be understood that the circuit specifications of the degenerative amplifier of the invention may vary according to the design for any particular application, the following circuit specifications are included by way of example only:

| | | |
|---|---|---|
| Resistor 15 | ohms | 1,000 |
| Resistor 16 | do | 1,000 |
| Resistor 20 | do | 50,000 |
| Resistor 27 | do | 1,000,000 |
| Capacitor 18 | microfarads | .004 |
| Capacitor 26 | do | .001 |
| Capacitor 24 | do | .002 |
| Capacitor 22 | do | 2 |
| Battery 21 | volts | —60 |

There has thus been disclosed a degenerative amplifier including a semi-conductor device having an amplifier section and a rectifier section. The amplifier may be used to clip the negative portion of the input signal while the positive portion is amplified. Alternatively, only a predetermined portion of the negative portion of the input signal may be clipped by adjusting a resistor in the degenerative feedback connection.

What is claimed is:

1. A degenerative amplifier comprising a semi-conductor device, said device including a semi-conducting body, a base electrode, an emitter electrode and a collector electrode in contact with said body, a further electrode in rectifying contact with said body and spaced from said emitter and collector electrodes such a larger distance than the distance between said emitter and collector electrodes as to prevent substantial interaction between said further electrode and said emitter and collector electrodes, said further electrode cooperating with said base electrode to provide a rectifier, said base electrode, said emitter electrode and said collector electrode cooperating to provide an amplifier; a first impedance element connected in circuit between said base and emitter electrodes, means for impressing a reverse bias voltage between said collector and base electrodes, a second impedance element connected in circuit between said collector and emitter electrodes, an input circuit connected across a portion of said first impedance element for impressing an input signal thereon, an output circuit connected across said second impedance element for deriving an amplified output signal therefrom, and a feedback connection between said further electrode and said collector electrode to impress said amplified output signal on said further electrode and to develop a current through said first impedance element and said base electrode in response to a predetermined polarity of said output signal, said current opposing the current developed simultaneously by the opposite polarity of said input signal across said first impedance element and on said base electrode.

2. A degenerative amplifier as defined in claim 1 wherein said first impedance element is an unbypassed resistor and wherein a further impedance element is included in said feedback connection.

3. A degenerative amplifier comprising a semi-conductor device, said device including a semi-conducting body, a base electrode, an emitter electrode and a collector electrode in contact with said body, and a further electrode in rectifying contact with said body, said further electrode being spaced from said emitter and collector electrodes such a distance as to prevent substantially any interaction between said further electrode and said emitter and collector electrodes, said further electrode cooperating with said base electrode to provide a rectifier, said base electrode, said emitter electrode and said collector electrode cooperating to provide an amplifier; a first impedance element connected between said base electrode and a point of substantially fixed potential, said emitter electrode being connected to said point, a source of voltage and a second impedance element connected serially between said collector electrode and said point, said source being so poled as to impress a reverse voltage between said collector and base electrodes, a feedback connection including a third impedance element connected between said collector electrode and said further electrode, an input circuit for applying an input signal between said point and a portion of said first impedance element, and an output circuit connected across said second impedance element, whereby the current flowing between said further electrode and said base electrode and through said first impedance element in response to a predetermined polarity of the input signal opposes the current flowing through said first impedance element in response to said predetermined polarity of the impressed input signal.

4. A degenerative amplifier as defined in claim 3 wherein said first impedance element is an unbypassed resistor.

5. A degenerative amplifier as defined in claim 3 wherein said first and second impedance elements are resistors and wherein said third impedance element includes a further resistor and a capacitor connected serially between said collector electrode and said further electrode.

6. A degenerative amplifier comprising a semi-conductor device, said device including an N type semi-conducting body, a base electrode, an emitter electrode and a collector electrode in contact with said body, a further electrode in rectifying contact with said body, and spaced from said emitter and collector electrodes such a distance as to prevent substantial interaction between said further electrode and said emitter and collector electrodes, said further electrode and said base electrode constituting respectively the anode and cathode of a rectifier, said base, emitter and collector electrodes constituting an amplifier; a first impedance element connected between said base electrode and ground, an input circuit connected between an intermediate point of said first element and ground for impressing an input signal on said base electrode, said emitter electrode being grounded, a source of voltage and a second impedance element connected in series, the positive terminal of said source being grounded and said second element being connected to said collector electrode, an output circuit coupled across said second element, and a feedback connection between said collector electrode and said further electrode, thereby to develop a current flowing through said further electrode, said base electrode and said first element in response to the negative portion of the input signal which opposes the current flowing in response to said negative portion of the input signal through said first element.

7. A degenerative amplifier comprising a semi-conductor device, said device including an N type semi-conducting body, a base electrode, an emitter electrode and a collector electrode in contact with said body, a further electrode in rectifying contact with said body and spaced from said emitter and collector electrodes such a distance as to prevent substantial interaction between said further electrode and said emitter and collector electrodes, said further electrode and said base electrode constituting respectively the anode and cathode of a rectifier, said base, emitter and collector electrodes constituting an amplifier; a first resistor connected between said base electrode and ground, an input circuit connected between an intermediate point of said first resistor and ground for impressing an input signal on said base electrode, said emitter electrode being grounded, a source of voltage and a second resistor connected in series, the positive terminal of said source being grounded and said second resistor being connected to said collector electrode, a capacitor and a third resistor connected between said collector electrode and said further electrode, an output circuit coupled across said second resistor, and said third resistor being adjustable, thereby to adjust the portion of the current flowing through said further electrode, said base electrode and said first resistor in response to the negative portion of the input signal only.

References Cited in the file of this patent

UNITED STATES PATENTS

| Number | Name | Date |
|---|---|---|
| 2,390,502 | Atkins | Dec. 11, 1945 |
| 2,402,661 | Ohl | June 25, 1946 |
| 2,476,323 | Rack | July 19, 1949 |
| 2,541,322 | Barney | Feb. 13, 1951 |
| 2,560,709 | Woodward | July 17, 1951 |
| 2,585,078 | Barney | Feb. 12, 1952 |

OTHER REFERENCES

Electronics, September 1948, pp. 68–71. Copy in 179–171–MB.

Physical Review, July 15, 1948, pp. 231–232. Copy in 179–171–MB.